(12) United States Patent
Nakamura et al.

(10) Patent No.: US 7,696,553 B2
(45) Date of Patent: Apr. 13, 2010

(54) SEMICONDUCTOR STORAGE DEVICE AND METHOD FOR MANUFACTURING THE SAME

(75) Inventors: Yoshitaka Nakamura, Tokyo (JP); Keiji Kuroki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 109 days.

(21) Appl. No.: 11/519,141

(22) Filed: Sep. 12, 2006

(65) Prior Publication Data

US 2007/0057306 A1   Mar. 15, 2007

(30) Foreign Application Priority Data

Sep. 15, 2005  (JP)  ............................. 2005-267931

(51) Int. Cl.
    *H01L 29/76* (2006.01)
(52) U.S. Cl. ................ 257/300; 257/301; 257/E27.084
(58) Field of Classification Search ................. 257/300, 257/301, E27.084
    See application file for complete search history.

(56) References Cited

U.S. PATENT DOCUMENTS

| 5,981,331 | A | * | 11/1999 | Tsunemine | 438/240 |
| 6,207,524 | B1 | * | 3/2001 | Gutsche | 438/396 |
| 6,555,429 | B2 | * | 4/2003 | Matsui et al. | 438/241 |
| 6,707,088 | B2 | * | 3/2004 | Fishburn | 257/296 |
| 7,163,859 | B2 | * | 1/2007 | Kim et al. | 438/253 |
| 7,253,101 | B2 | * | 8/2007 | Park et al. | 438/643 |
| 2002/0030222 | A1 | * | 3/2002 | Agarwal | 257/310 |
| 2002/0093073 | A1 | * | 7/2002 | Mori et al. | 257/510 |
| 2002/0094652 | A1 | * | 7/2002 | Akram et al. | 438/301 |
| 2006/0079049 | A1 | * | 4/2006 | Kundalgurki et al. | 438/243 |
| 2007/0145525 | A1 | * | 6/2007 | Wang et al. | 257/532 |

FOREIGN PATENT DOCUMENTS

| JP | 07-030077 A | 1/1995 |
| JP | 8-316435 A | 11/1996 |
| JP | 10-209391 A | 8/1998 |
| JP | 2002-170940 A | 6/2002 |
| JP | 2002-334940 A | 11/2002 |

* cited by examiner

*Primary Examiner*—Eugene Lee
(74) *Attorney, Agent, or Firm*—Sughrue Mion, PLLC

(57) ABSTRACT

A semiconductor storage device is manufactured by the following steps. A cylindrical hole is formed in an interlayer insulating film. Then, a multilayer conductive layer including a first sublayer and a second sublayer is formed over the entire surface of the insulating interlayer including the internal surface of the hole. The second sublayer has a higher nitrogen content than the first sublayer. A cup-like lower electrode is formed by reactive ion etching of the conductive layer under conditions that the second sublayer is etched faster than the first sublayer, so that the conductive layer remains only on the internal surface of the hole, and so that the upper edge of the remaining conductive layer forms an angle of 45° or less with the internal wall of the hole. Then, a capacitor insulating layer and an upper electrode are formed in that order on the lower electrode.

7 Claims, 17 Drawing Sheets

SEMICONDUCTOR STORAGE DEVICE AND METHOD FOR MANUFACTURING THE SAME

This application claims priority to prior Japanese patent application JP 2005-267931, the disclosure of which is incorporated herein by reference.

BACKGROUND OF THE INVENTION

1. Field of the Invention

The present invention relates to semiconductor storage devices, particular to a DRAM (dynamic random access memory), and a method for manufacturing the same.

2. Description of the Related Art

The memory cell of a DRAM includes a selection transistor and a capacitor. The charge storage of the capacitor is disadvantageously decreasing as the memory cell is miniaturized associating with the progress of microfabrication. In order to overcome this disadvantage, the memory cell has begun to employ a capacitor-over-bitline (COB) structure or a stacked trench capacitor (STC) structure. Specifically, the capacitor is formed over the bitline to increase its base area (projected area) and height, and thus to increase the total area. Typical forms of such capacitors have disclosed in Japanese Unexamined Patent Application Publication Nos. 2002-170940 and 8-316435.

Japanese Unexamined Patent Application Publication No. 2002-170940 has disclosed a COB DRAM cell and a method for manufacturing the COB DRAM cell. The COB DRAM includes a capacitor using a cup-like ruthenium layer as a lower electrode. The ruthenium layer is formed along the internal surface of a hole formed in an insulating interlayer, and has a double-layer structure composed of a first ruthenium sublayer deposited by sputtering and a second ruthenium sublayer deposited by CVD (chemical vapor deposition). However, this patent document does not mention the problem that the shape of the upper end of the lower electrode causes electric field concentration and thus increases the leakage current from the capacitor insulating layer.

Japanese Unexamined Patent Application Publication No. 8-316435 has disclosed a structure using a cup-like polycrystalline silicon layer as the lower electrode. In Japanese Unexamined Patent Application Publication No. 2002-170940, only the internal surface of the cup-like ruthenium layer functions as the lower electrode, while the cup-like polycrystalline silicon layer in Japanese Unexamined Patent Application Publication No. 8-316435 functions as the lower electrode at the internal and external surfaces. In this polycrystalline silicon lower electrode, the upper end is rounded in an addition step to prevent the increase in leakage current resulting from the electric field concentration.

It is considered that such adjustment in the shape of the upper end of the lower electrode reduces the leakage current to some extent.

On the other hand, cost reduction is strongly required in manufacture of DRAM. It is desirable that the upper end of the lower electrode be adjusted without adding a special step as disclosed in Japanese Unexamined Patent Application Publication No. 8-316435. However, the material of the lower electrode (ruthenium, polycrystalline silicon, titanium nitride, etc.) is difficult to form into a desired shape by etching. Furthermore, a photoresist layer and an insulating interlayer are present on the semiconductor substrate when the lower electrode material is etched, and a high etching selectivity of the lower electrode material to those layers must be ensured. It is therefore difficult to adjust the shape of the upper end of the lower electrode.

SUMMARY OF THE INVENTION

The present invention provides a semiconductor storage device including a highly reliable capacitor which has a lower electrode whose shape has been adjusted at the upper end so as to reduce the leakage current without performing any additional step, and a method for manufacturing the same.

According to an aspect of the present invention, a method for manufacturing a semiconductor storage device includes the step of forming a capacitor. The step of forming the capacitor comprises the sub steps of (1) forming a cylindrical hole in an insulating interlayer, and (2) forming a multilayer conductive layer including a first sublayer and a second sublayer deposited in that order on the entire surface of the insulating interlayer including the internal surface of the hole. The second sublayer has a higher nitrogen content than the first sublayer. The step of forming the capacitor further includes the sub step of (3) forming a cup-like lower electrode by reactive ion etching of the conductive layer under conditions that the second sublayer is etched faster than the first sublayer, so that the conductive layer remains only on the internal surface of the hole, and so that the upper edge of the remaining conductive layer forms an angle of about 45° or less with the internal wall of the hole. A step (4) is further performed in which a capacitor insulating layer and an upper electrode are formed in that order on the lower electrode.

Preferably, the reactive ion etching is performed under a pressure in the range of 1 to 30 mTorr.

The conductive layer may further includes at least one sublayer, and the sub step of forming the conductive layer may be performed by depositing materials containing nitrogen so that the nitrogen contents in the sublayers gradually increase. The reactive ion etching of the conductive layer is performed under conditions that the etching rate increases as the nitrogen content in the sublayer is increased.

Preferably, the reactive ion etching uses an etching gas containing chlorine. The conductive layer may be formed of a metal nitride, and preferably of titanium nitride.

The invention is based on the findings that the reactive ion etching rate of a metal nitride layer, such as a titanium nitride layer, depends on the contents of titanium and nitrogen. Specifically, the etching rate decreases as the nitrogen content is reduced (titanium content is increased), and the etching rate increases as the nitrogen content is increased (titanium content is reduced). This phenomenon is used for forming the capacitor lower electrode.

The present invention has the following advantages:

(1) Since the tilt angle of the upper end of the capacitor lower electrode can be adjusted at 45° or less without performing an additional step, an electric field is prevented from concentrating on the capacitor insulating layer, and the increase in leakage current is thus prevented.

(2) The advantage described in the above (1) leads to the effect of enhancing the reliability of the resulting capacitor.

(3) The advantage described in the above (2) leads to the effect of enhancing the reliability of the resulting DRAM.

DESCRIPTION OF THE PREFERRED EMBODIMENTS

The present invention will be further described using the following embodiments with reference to the drawings.

(1) Structures of DRAM and Capacitor

Figure 1:
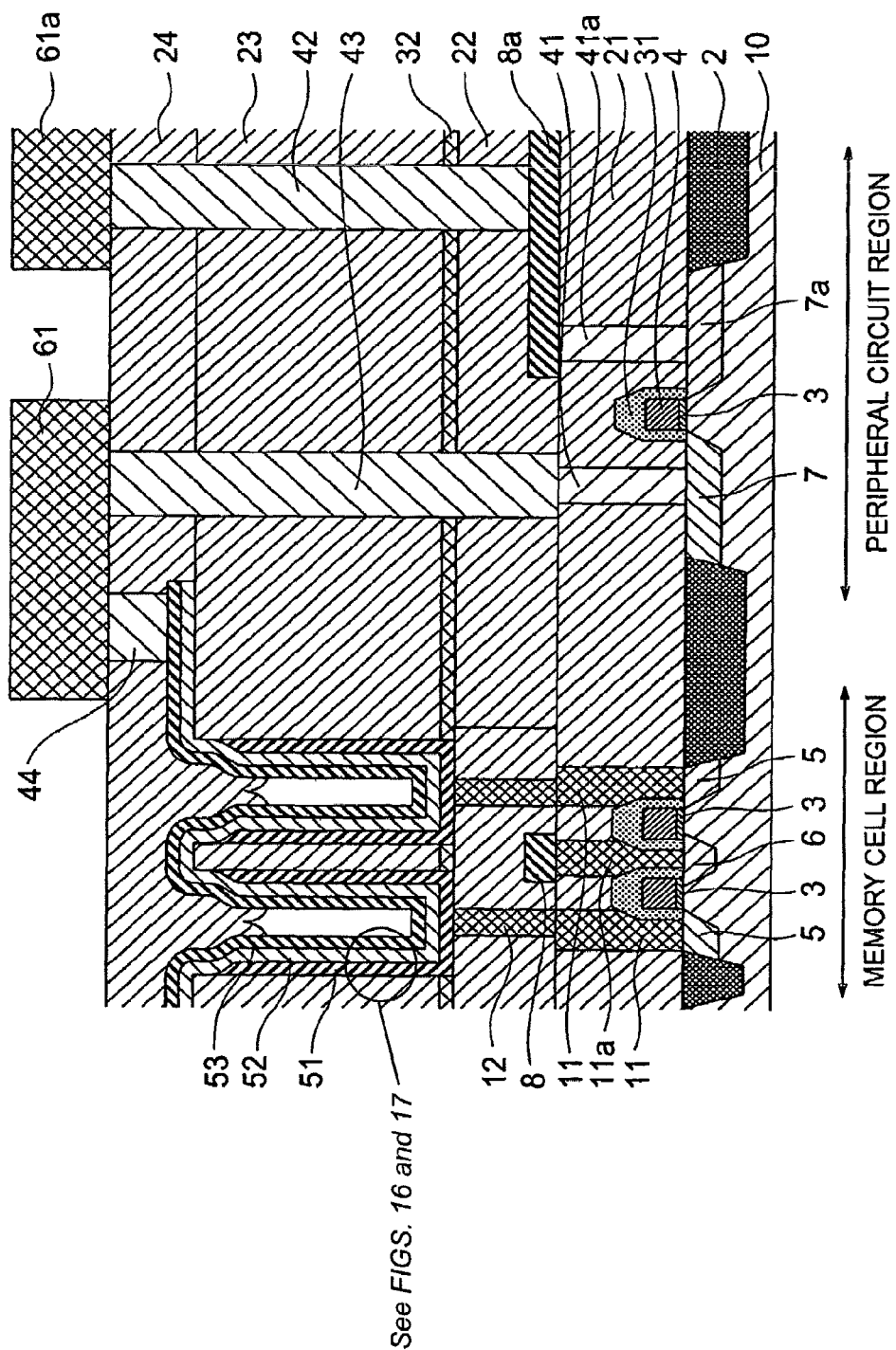
FIG. 1 is a sectional view of a semiconductor storage device according to an embodiment of the present invention.

FIG. 1 is a vertical sectional view of a DRAM according to an embodiment. The DRAM has a memory cell region including two selection transistors in its active region that is defined by compartmenting the main surface of a silicon substrate 10 with portions of a separation insulating layer 2. Each selection transistor includes a gate electrode 4 on the surface of the silicon substrate 10 with a gate insulating layer 3 in between, a source region 5, and a drain region 6. The gate electrode 4 is covered with an insulating layer 31. The drain region 6 is shared between the two selection transistors. The drain region 6 is connected to a tungsten bit line 8 with a polysilicon plug 11a passing through an interlayer insulating film 21.

The bit line 8 is covered with an interlayer insulating film 22. Another two interlayer insulating films 32 and 23 are formed on the insulating interlayer 22, and provided with holes. The internal surface of each hole is coated with a lower electrode 51 made of a first titanium nitride layer, a capacitor insulating layer 52 made of aluminium oxide, and an upper electrode 53 made of a second titanium nitride layer, in that order. In this manner, a capacitor is formed. The lower electrode has a cup-like shape, and its internal surface functions as the capacitor electrode. The upper end of the lower electrode 51 is inclined toward the inside of the cup.

The bottom of the lower electrode 51 is in contact with a polysilicon plug 12. This polysilicon plug 12 is connected to the source region 5 of the corresponding transistor via an underlying polysilicon plug 11. Further, a second wiring layer 61 is formed over the upper electrode 53 via a connection plug 44 passing through the interlayer insulating film 24.

Figure 2:
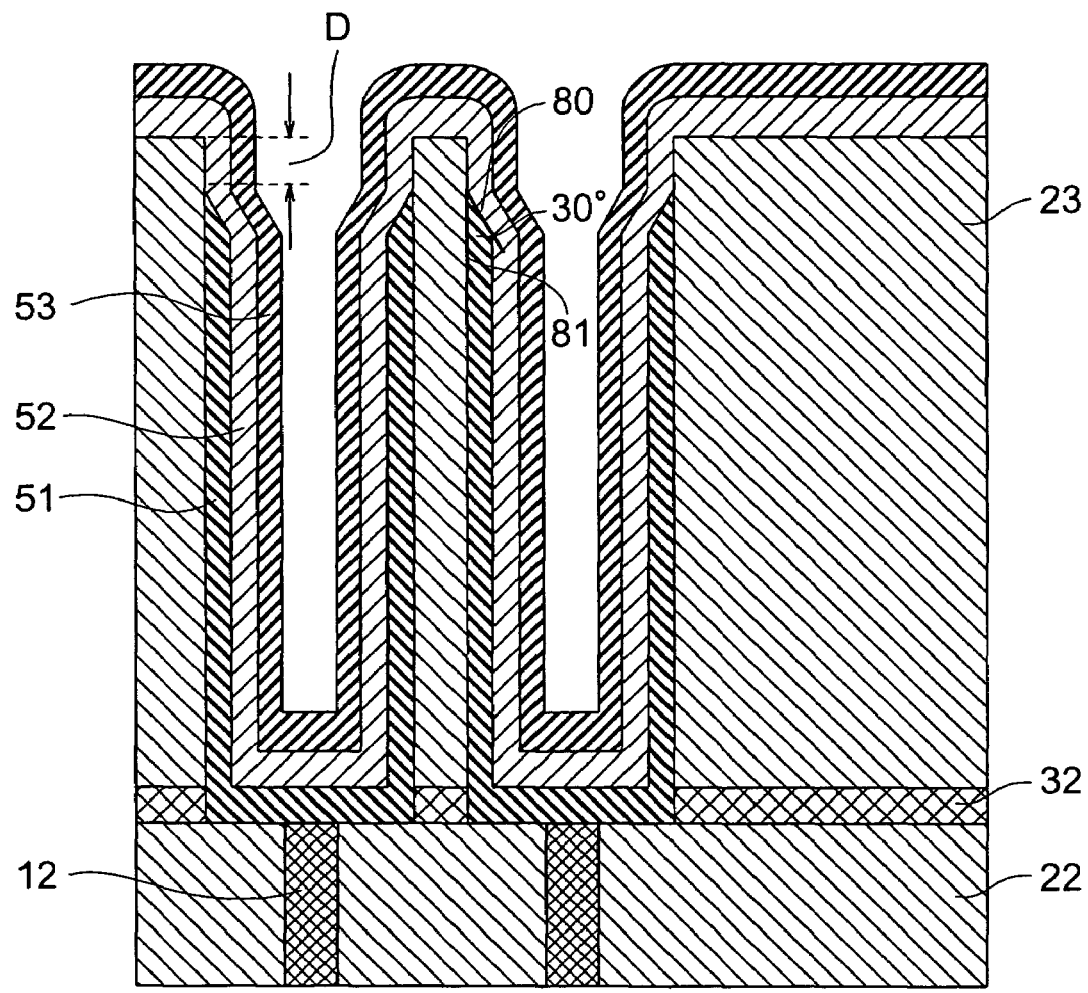
FIG. 2 is a sectional view of a capacitor of the semiconductor storage device according to the embodiment.

As shown in FIG. 2, which is an enlarged view of the capacitor, the upper edge 80 of the lower electrode 51 and the internal wall 81 of the hole form an angle of about 30°.

The DRAM also has a peripheral circuit region including a peripheral circuit transistor in its active region that is defined by compartmenting the main surface of the silicon substrate 10 with portions of the separation insulating layer 2. The peripheral circuit transistor includes a gate electrode 4 on the surface of the silicon substrate 10 with the gate insulating layer 3 in between, a source region 7, and a drain region 7a. The gate electrode 4 is covered with the insulating layer 31. The source region 7 of the peripheral circuit transistor is connected to the second wiring layer 61 via metal plugs 41 and 43. The drain region 7a is connected to a first wiring layer 8a via a metal plug 41a. The first wiring layer 8a is further connected to the second wiring layer 61a via a metal plug 42.

(2) Method for Manufacturing DRAM Including Capacitor

A method for manufacturing the DRAM shown in FIG. 1, including the capacitor shown in FIG. 2 will now be described with reference to FIGS. 3 to 11.

Figure 3:
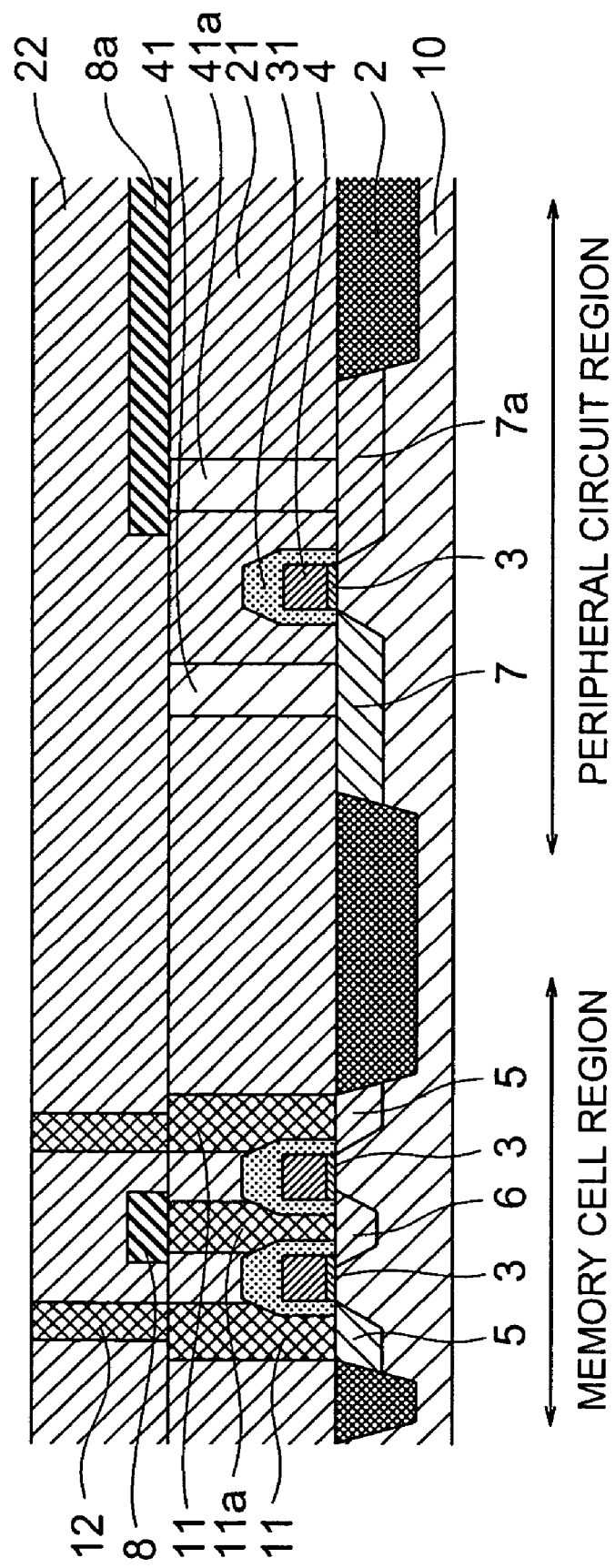
FIG. 3 is a sectional view of a step of a method for manufacturing a semiconductor storage device according to an embodiment of the present invention.

First, the main surface of the silicon substrate 10 is compartmented with the separation insulating layer 2, followed by forming the gate insulating layer 3, the gate electrodes 4 covered with the insulating layer 31, the source regions 5 and 7, the drain regions 6 and 7a, the polysilicon plugs 11 and 11a, the metal plugs 41 and 41a, and the bit line 8 and the first wiring layer 8a, as shown in FIG. 3. The bit line 8 and the first wiring layer 8a are covered with the interlayer insulating film 22 made of silicon oxide, and contact holes are formed so as to pass through the interlayer insulating film 22. The contact holes are filled with polysilicon to form polysilicon plugs 12, followed by etch back of the interlayer insulating film 22.

Figure 4:
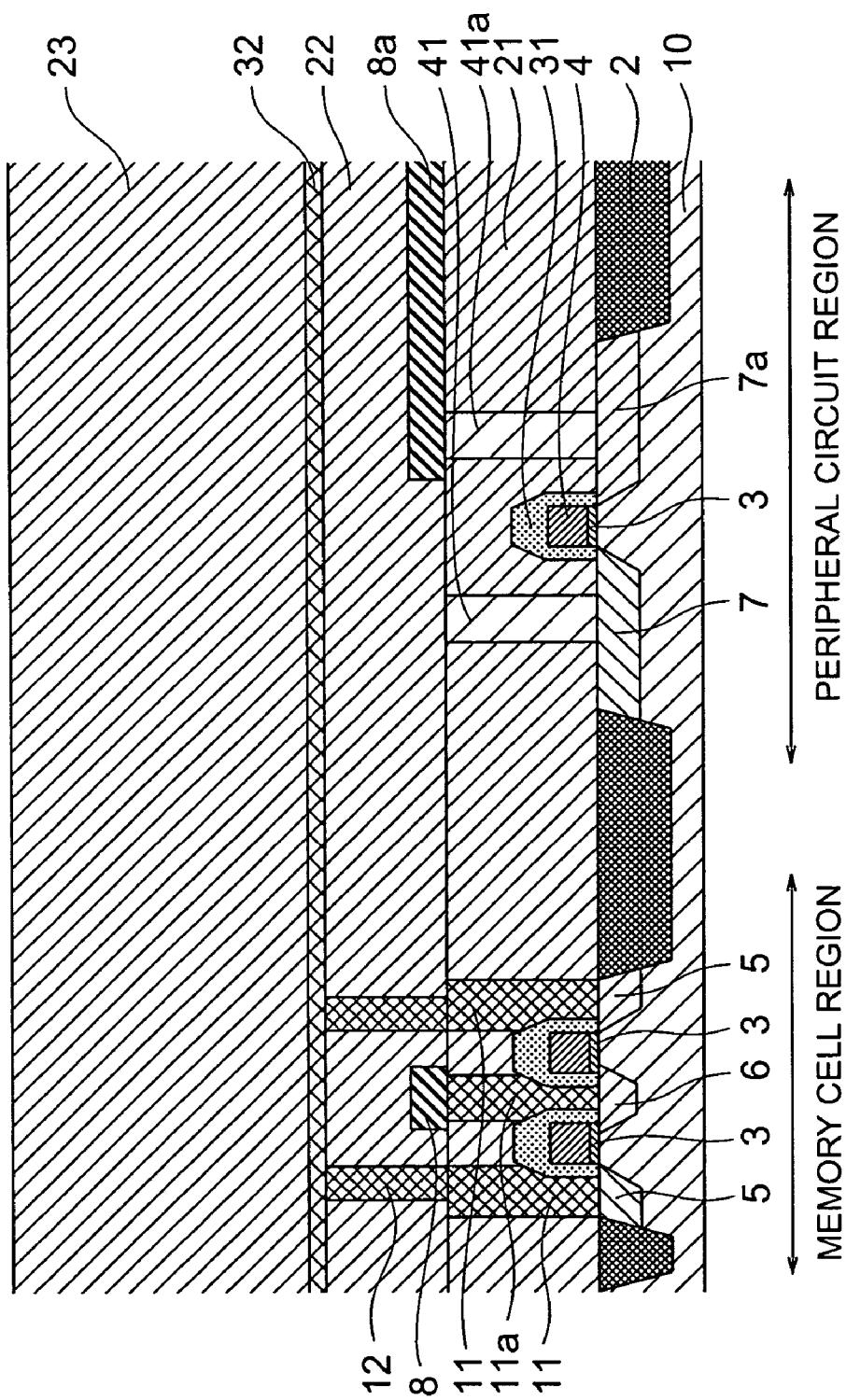
FIG. 4 is a sectional view of a step of the method according to the embodiment.

Turning to FIG. 4, a 50 nm thick interlayer insulating film 32 made of silicon nitride and a 3,000 nm thick interlayer insulating film 23 made of silicon oxide are formed in that order by known CVD.

Figure 5:
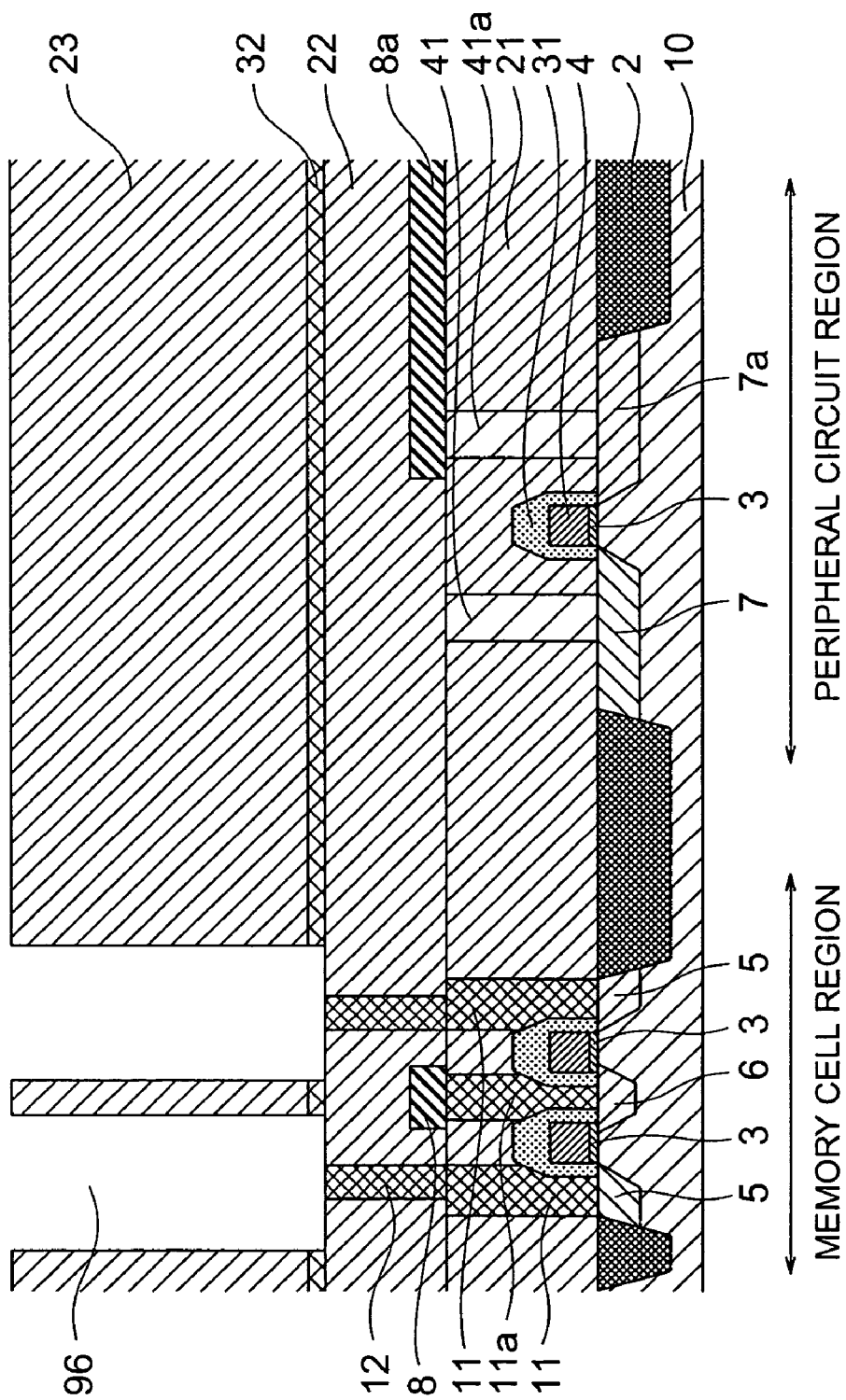
FIG. 5 is a sectional view of a step of the method according to the embodiment.

Turning to FIG. 5, holes 96 passing through the interlayer insulating films 23 and 32 are formed to expose the surfaces of the polysilicon plugs 12 by anisotropic dry etching using a plasma containing fluorine.

Figure 6:
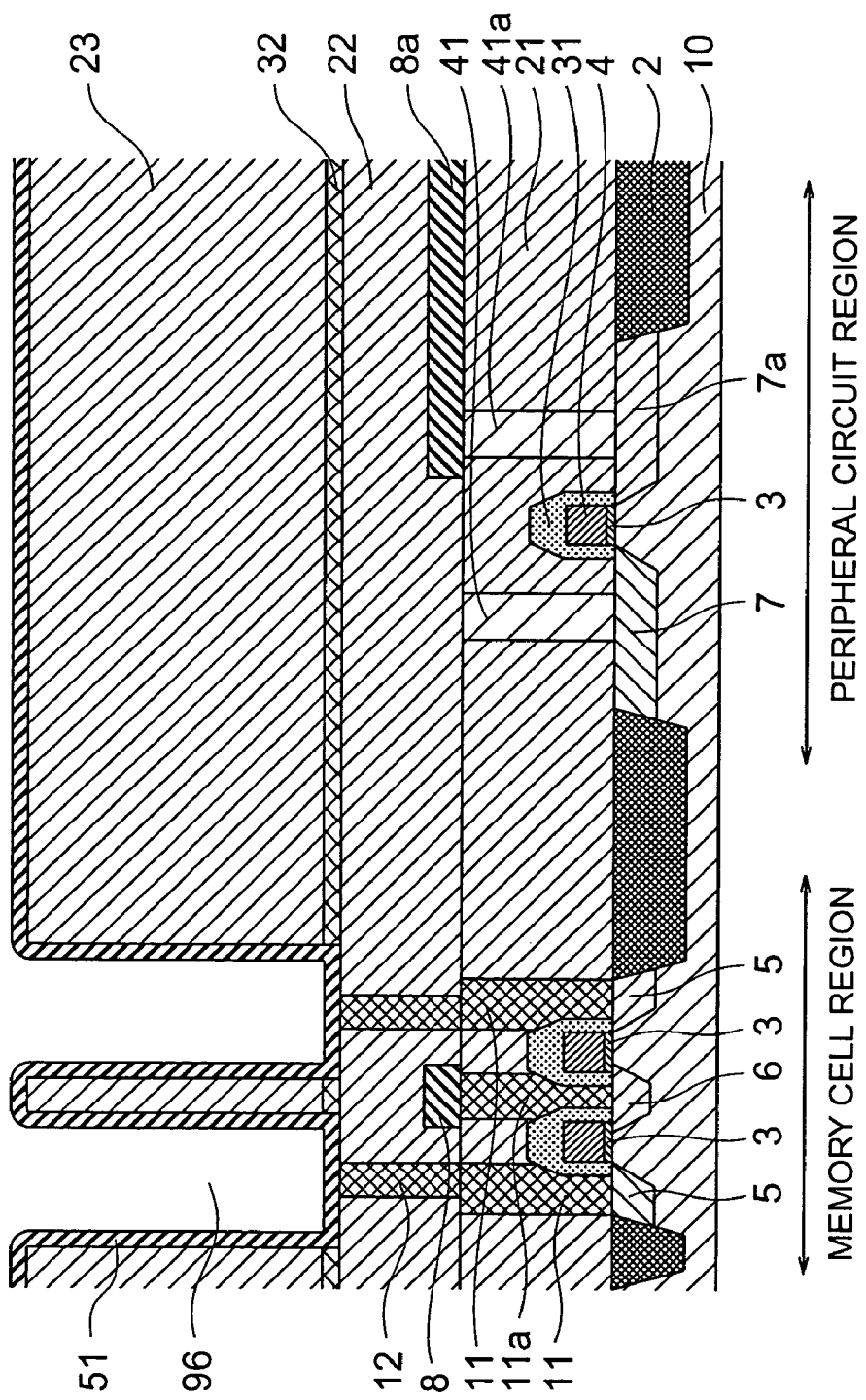
FIG. 6 is a sectional view of a step of the method according to the embodiment.

Turning to FIG. 6, a first titanium nitride layer is formed for the lower electrode 51 by depositing a 1 nm thick first sublayer and a 6 nm thick second sublayer in that order. The first sublayer contains less nitrogen than the second sublayer. According to Rutherford backscattering spectroscopy (RBS), the first sublayer has a nitrogen content of 10% and the second sublayer has a nitrogen content of 50%. The nitrogen content here is defined by the following equation:

Nitrogen content(%)=number of nitrogen atoms/ (number of titanium atoms+number of nitrogen atoms)

For the formation of the first sublayer having a lower nitrogen content, titanium tetrachloride is thermally decomposed at 640° C. to deposit a titanium layer, and the titanium layer is nitrided by heat treatment at the same temperature in a nitrogen atmosphere for 1 minute. The second sublayer having a higher nitrogen content is formed by CVD based on a chemical reaction between titanium tetrachloride and ammonia, using ammonia substituted for the nitrogen used in the above heat treatment. The first sublayer and the second sublayer are continuously formed in the same apparatus. While the titanium content in the first sublayer having a lower nitrogen content is as high as about 90%, the titanium content in the second sublayer having a higher nitrogen content is as low as about 50%.

Figure 7:
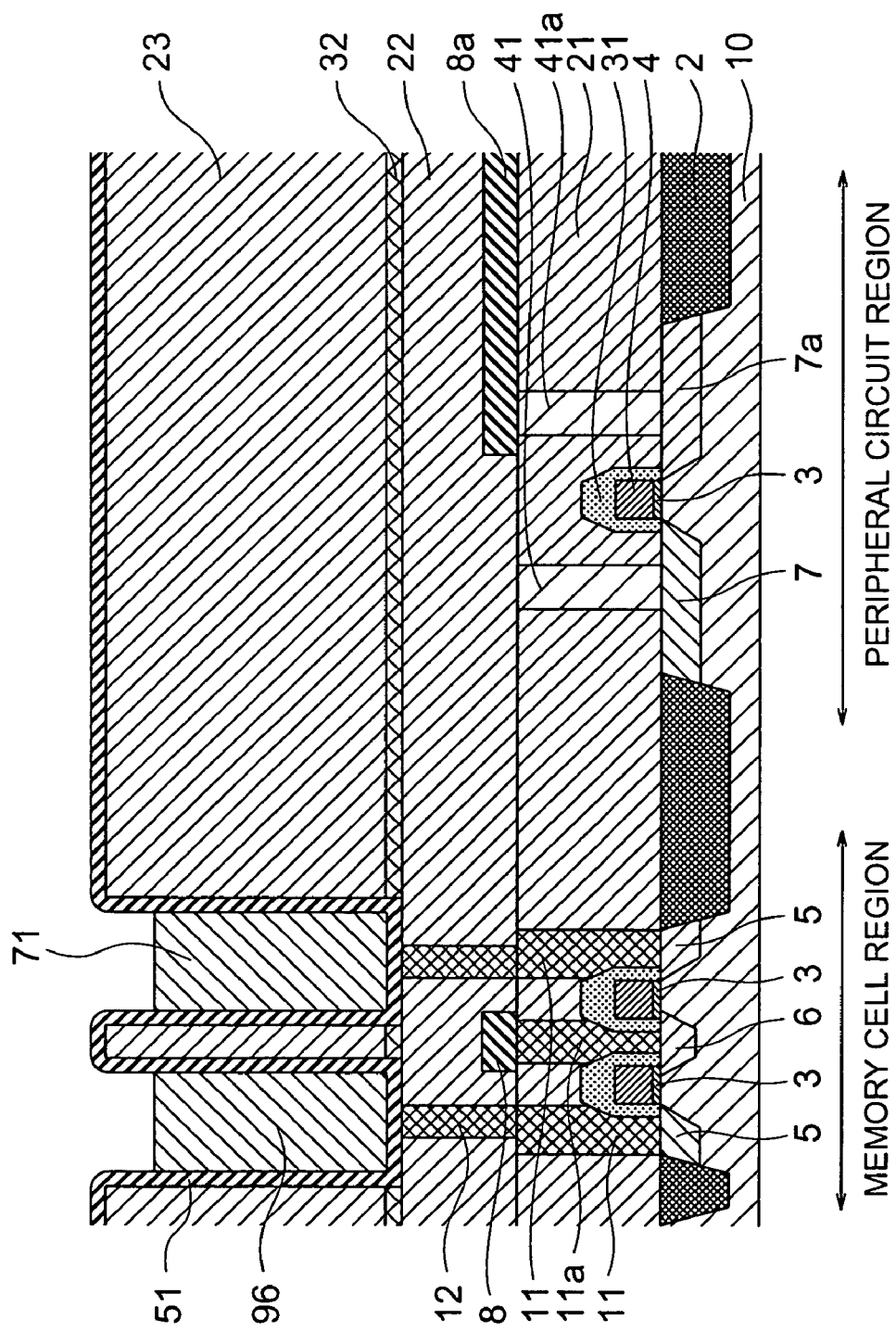
FIG. 7 is a sectional view of a step of the method according to the embodiment.

Turning to FIG. 7, a photoresist layer 71 is formed in the holes. The photoresist layer 71 prevents the titanium nitride layer at the bottoms of the holes from being removed by etching in case where when etchback for the titanium nitride layer is carried out in the subsequent step. Specifically, for the formation of the photoresist layer 71, a photoresist is deposited over the entire surface of the first titanium nitride layer by a known technique, and the deposited photoresist is exposed under the conditions that the exposed lower limit line lies at a higher position in the hole. Subsequently, exposed regions are removed by development. In this manner, unexposed regions are left in the hole.

Figure 8:
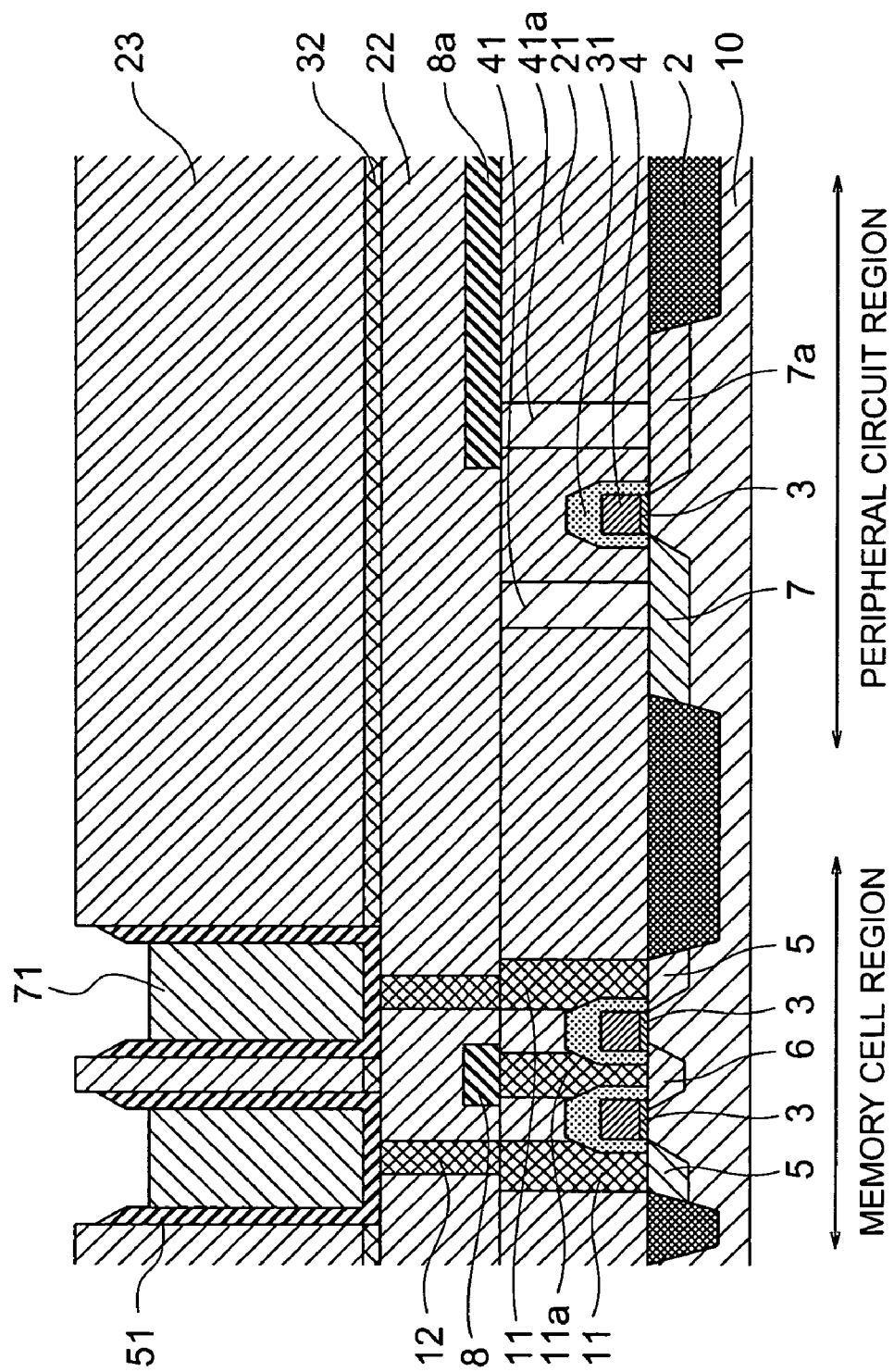
FIG. 8 is a sectional view of a step of the method according to the embodiment.

Turning to FIG. 8, the titanium nitride layer is etchbacked by reactive ion etching to remove its portions lying on the surface of the interlayer insulating film 23 except the internal walls of the holes. The reactive ion etching is performed using chlorine and argon as the etching gas at flow rates of 40 and 20 sccm respectively for 40 seconds at a total pressure of 10 mTorr, a high frequency plasma power of 800 W, and a high frequency bias power of 80 W. As a result, the first titanium nitride layer is etched such that the second sublayer (having a higher nitrogen content and a lower titanium content) is etched faster than the first sublayer (having a lower nitrogen content and a higher titanium content). Thus, the shape of the upper end of the lower electrode 51 can be controlled so that the upper edge of the lower electrode 51 and the internal wall of the hole form an angle of 45° or less.

Figure 9:
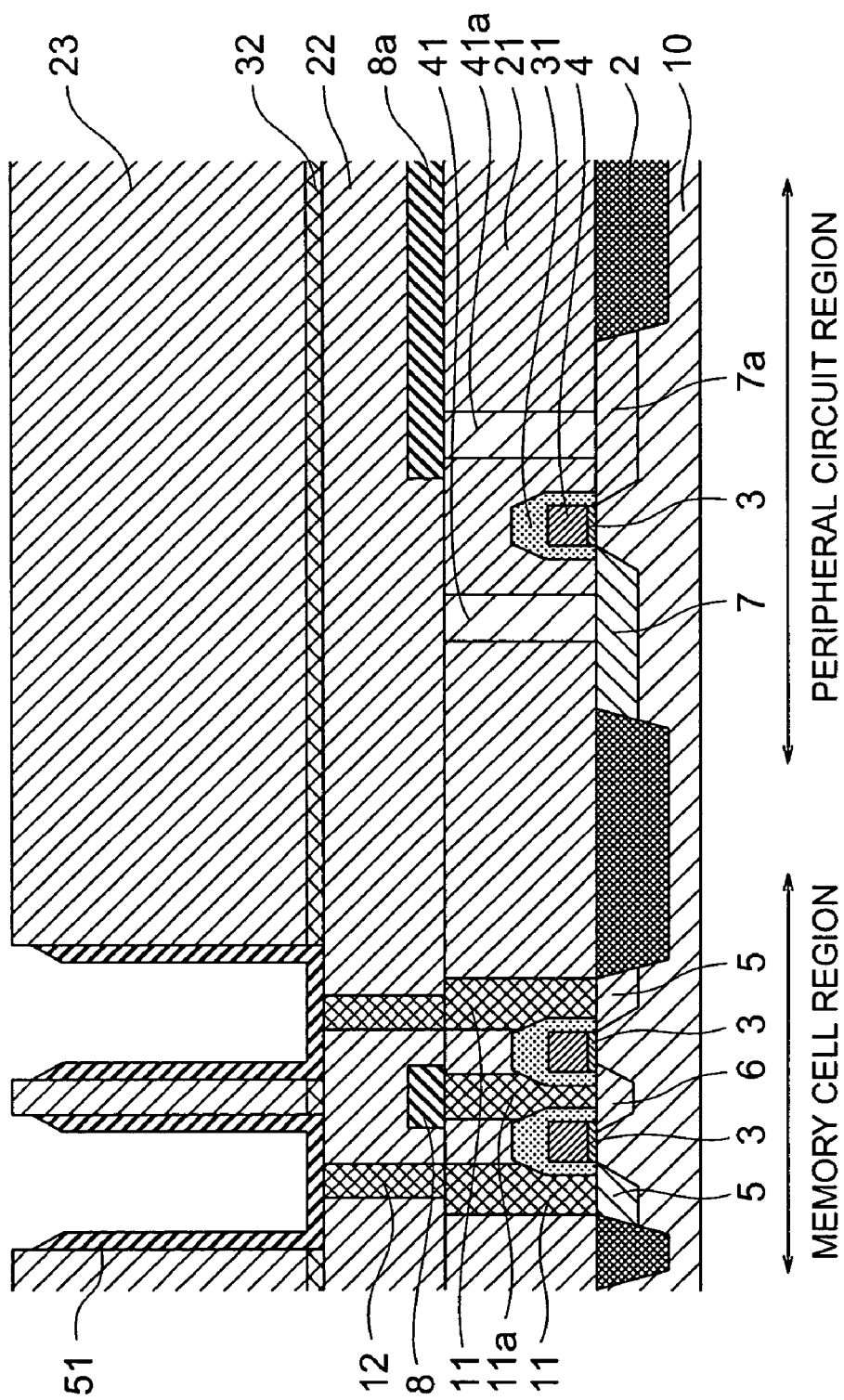
FIG. 9 is a sectional view of a step of the method according to the embodiment.

Turning to FIG. 9, the photoresist layer 71 is removed by the use of an organic remover. Thus, the lower electrode 51 is completed in a cup-like shape whose upper end is inclined at 45° or less.

Figure 10:
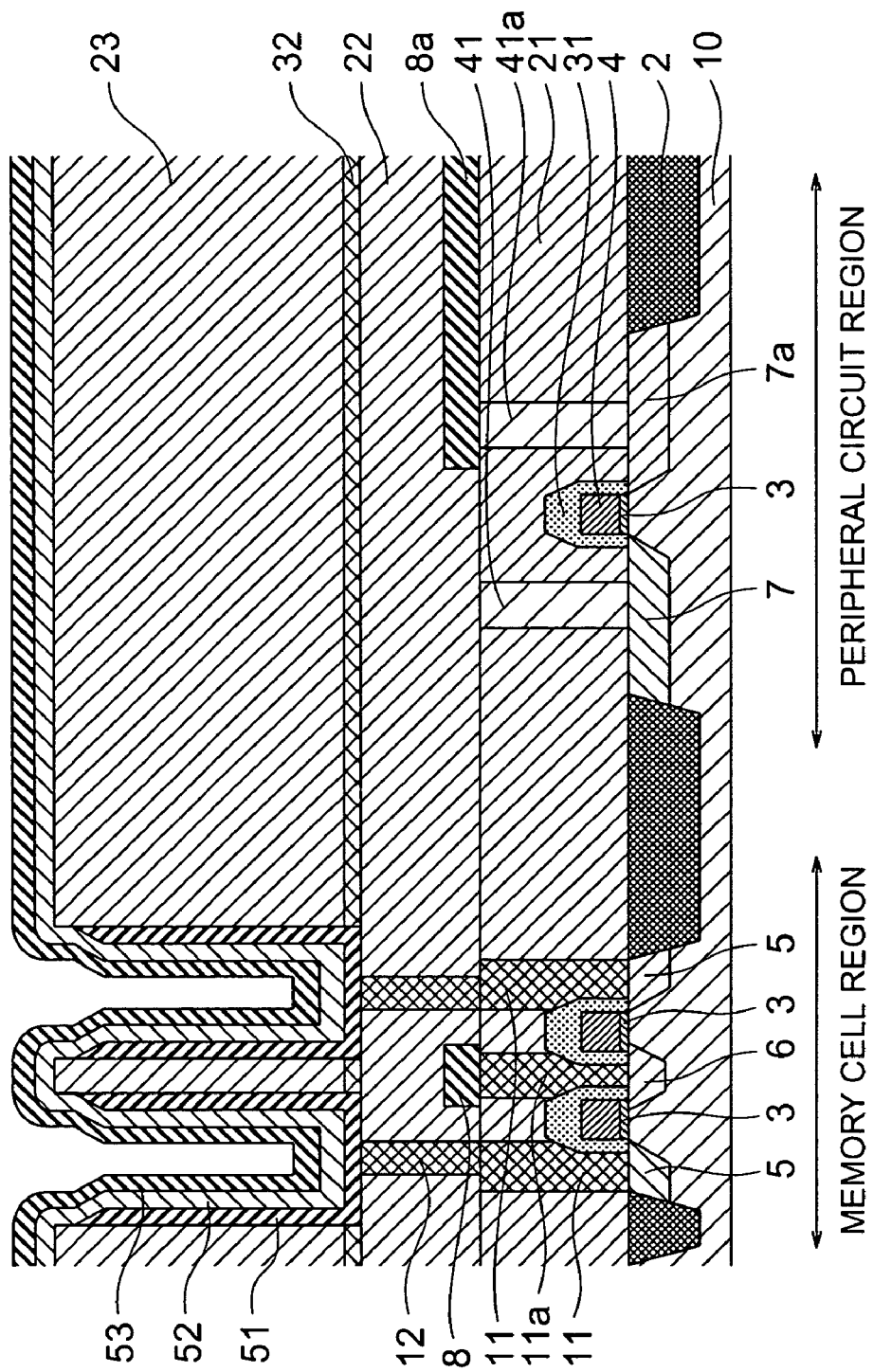
FIG. 10 is a sectional view of a step of the method according to the embodiment.

Turning to FIG. 10, a 6 nm thick aluminium oxide layer serving as the capacitor insulating layer 52 and a 15 nm thick second titanium nitride layer serving as the upper electrode 53 are deposited in that order. The aluminium oxide layer is formed by atomic layer deposition (ALD) using trimethyl aluminum and ozone as the reactant gas. The second titanium nitride layer is formed by CVD using titanium tetrachloride and ammonia as the reactant gas.

Figure 11:
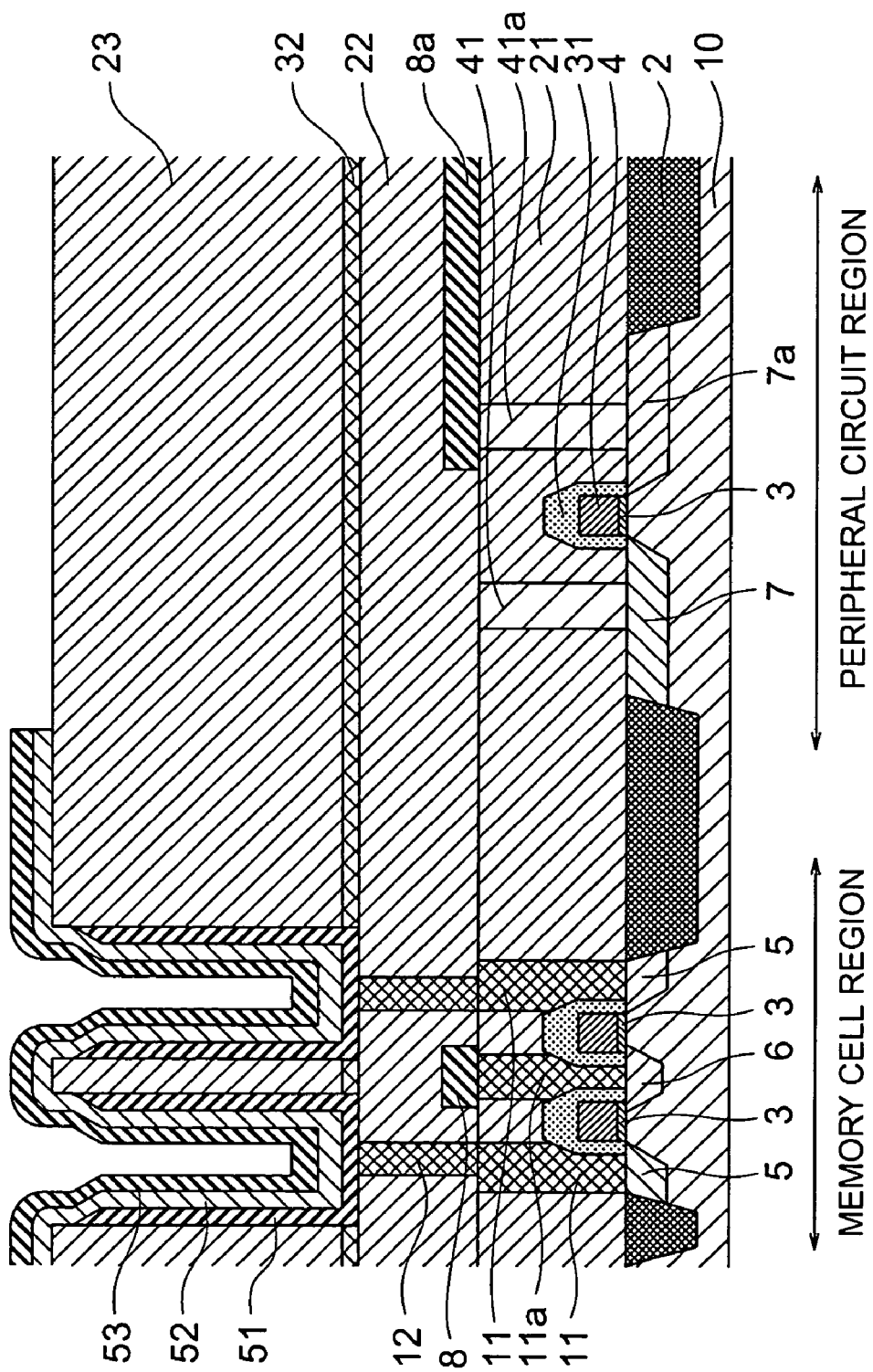
FIG. 11 is a sectional view of a step of the method according to the embodiment.

Turning to FIG. 11, the aluminium oxide layer and the second titanium nitride layer are shaped into the upper electrode 53 and the capacitor insulating layer 52 so as to cover the entire memory cell region by photolithography and dry etching. Thus, the capacitor with a height of about 3,000 nm including the cup-like lower electrode 51 is completed.

Then, after the interlayer insulating film 24 made of silicon oxide is formed as shown in FIG. 1, through holes are formed in the interlayer insulating films 24, 23, 32, and 22 and filled with titanium nitride and tungsten. Undesired titanium nitride and tungsten deposited on regions other than the through holes are removed by CMP, and thus the metal plugs 42, 43, and 44 are formed. Subsequently, a titanium nitride film, an aluminum film, and a titanium nitride film are deposited in that order by sputtering to form a composite layer. The composite layer is patterned into the second wiring layer including the wiring lines 61 and 61a by lithography and dry etching.

Although in the present embodiment, the first titanium nitride layer is subjected to reactive ion etching at a pressure of 10 mTorr in order to incline the upper edge of the lower electrode 51, the reactive ion etching may be performed at a pressure in the range of 1 to 30 mTorr. Pressures in this range can produce the same effect.

The reason will be described below. The reactive ion etching is promoted by a synergistic effect between sputter etching and reactive etching. The sputter etching etches titanium nitride by physical collision of ions in a plasma with the titanium nitride. The reactive etching etches the titanium nitride by a chemical reaction of a reactant gas excited in a plasma with the titanium nitride. In the reactive ion etching in the present embodiment, the sputter etching is dominant under a pressure of 1 mTorr or less, and the reactive etching is dominant under a pressure of 30 mTorr or more.

Since the sputter etching is based on physical collision, the etching rate does not depend much on the material of the layer to be etched. If the pressure is set at 1 mTorr or less so as to enhance the effect of the sputter etching, the tilt angle of the upper edge of the lower electrode 51 can be controlled to 45° or less, but the degree of shoulder cut designated by D in FIG. 2 is increased to reduce the capacitance of the capacitor. Further, the difference in etching selectivity between the photoresist layer 71 and the insulating interlayer 23 decreases, and the precision of the structure is degraded accordingly.

On the other hand, the reactive etching is based on a chemical reaction between the etching gas (chlorine) and the layer to be etched (titanium nitride layer), and accordingly the etching rate depends on the composition of the layer to be etched. If the pressure is set at 30 mTorr or more so as to enhance the effect of the reactive etching, the degree of the shoulder cut designated by D in FIG. 2 can be reduced, and the difference in etching selectivity between the photoresist layer 71 and the insulating interlayer 23 can be easily increased. However, the tilt angle of the upper edge of the lower electrode 51 cannot be controlled to 45° or less. Since the reactive etching does not produce the effect of the sputter etching, the lower electrode having the double-layer structure is stepped without rounding edges.

However, if the pressure falls within the range of 1 to 30 mTorr as in the present embodiment, the reactive etching and the sputter etching produce a synergetic effect and reduce the tilt angle of the upper edge of the lower electrode 51.

(3) Capacitor Analysis

Figure 12:
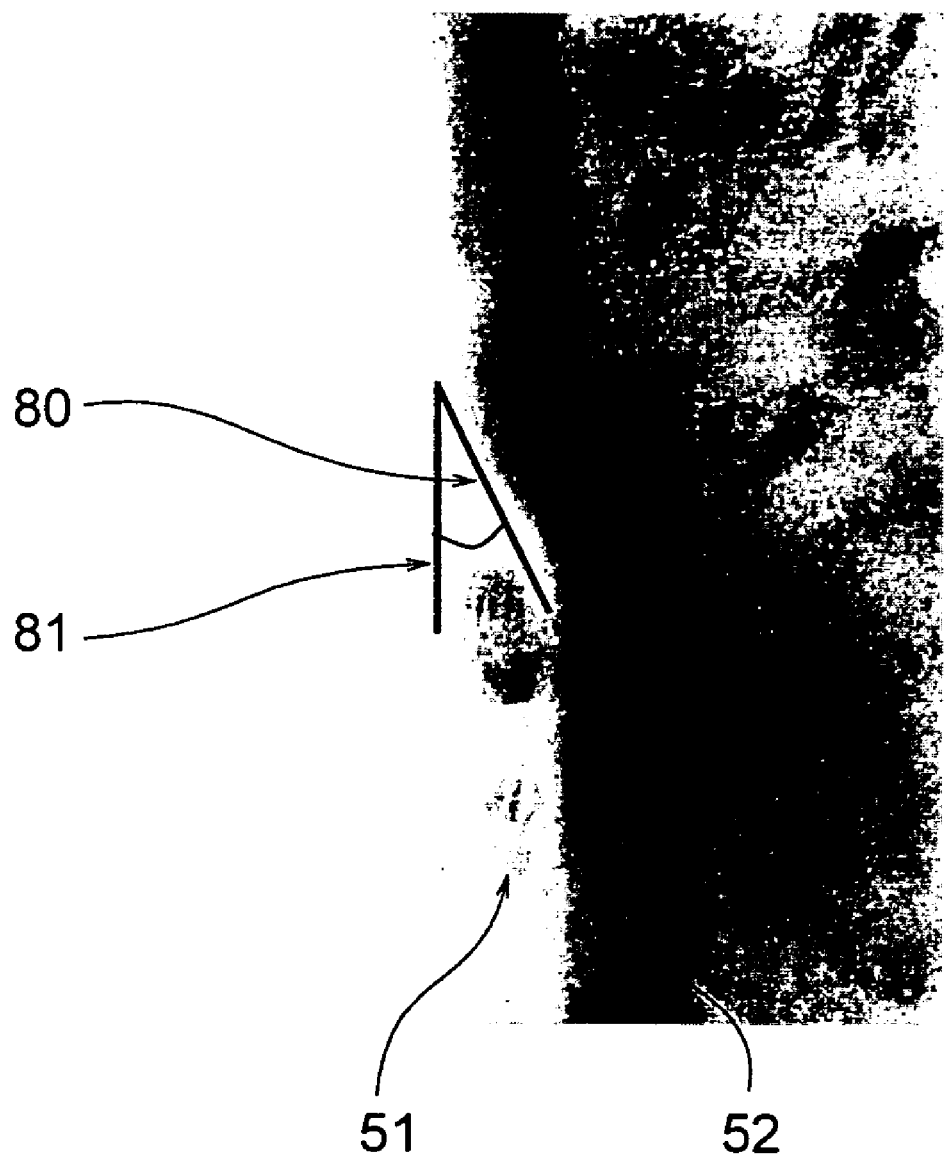
FIG. 12 is a transmission electron microscope image of the upper end of a capacitor lower electrode according to the embodiment.

FIG. 12 is a transmission electron microscope image of the section of the upper end of the lower electrode 51 shown in FIG. 2. FIG. 12 shows that the upper edge 80 of the lower electrode 51 forms an angle of about 30° with the internal surface 81 of the hole, and that the aluminium oxide capacitor insulating layer 52 does not have constrictions on which an electric field is liable to concentrate.

Figure 13:
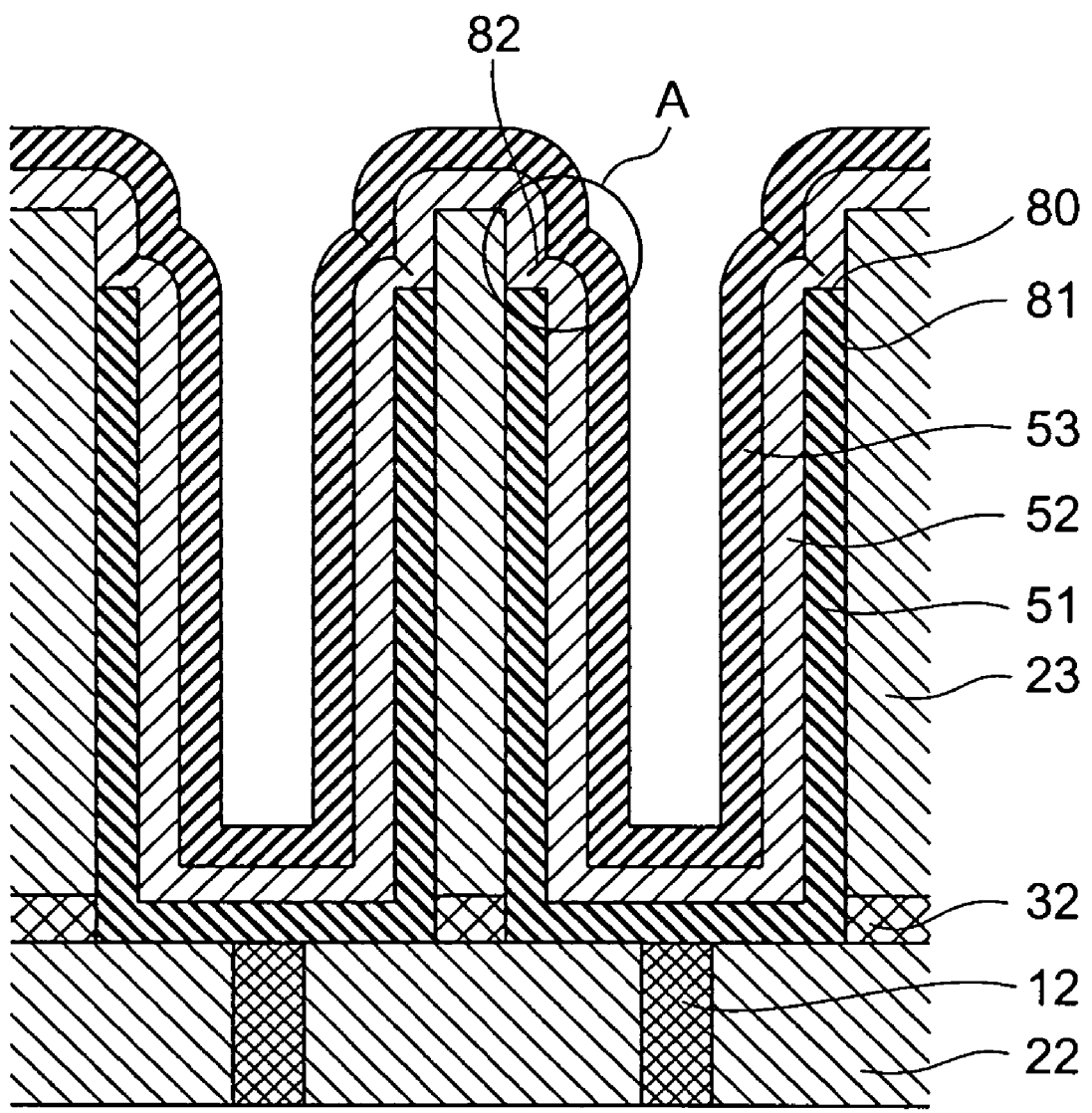
FIG. 13 is a sectional view of a capacitor of a comparative example.
Figure 14:
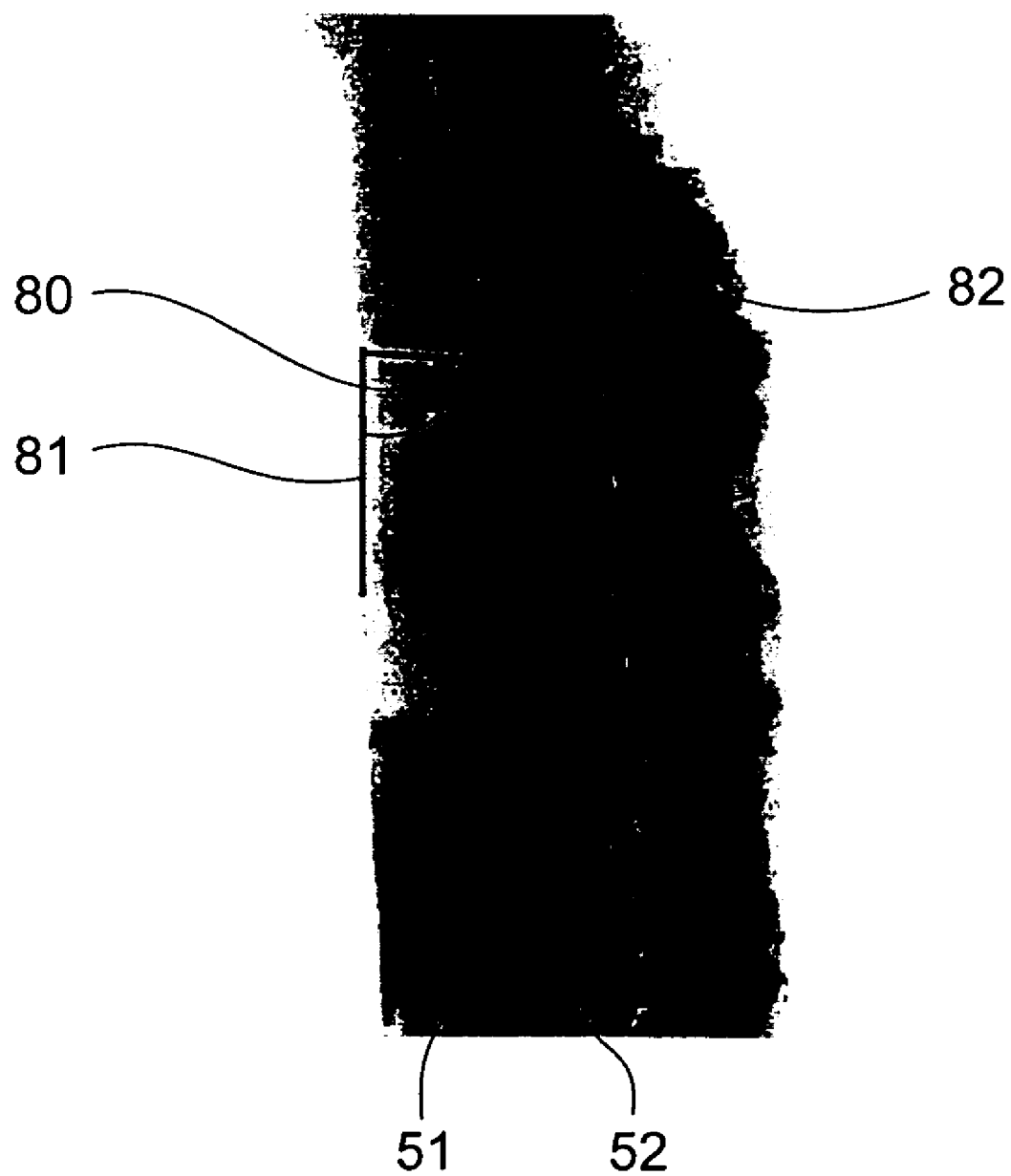
FIG. 14 is a transmission electron microscope image of the upper end of a capacitor lower electrode of the comparative example.

FIG. 13 is a vertical sectional view of a capacitor of a comparative example, including a lower electrode made of a single-layer titanium nitride film having a high nitrogen content (50%), and FIG. 14 is a transmission electron microscope image of the upper end of the lower electrode 51 surrounded by the circle shown in FIG. 13. In this case, the upper edge 80 of the lower electrode 51 forms an angle of about 85° with the internal surface 81 of the hole. It is clearly shown that the lower electrode made of a single-layer titanium nitride film does not have a small tilt angle at the upper end. Consequently, the aluminium oxide capacitor insulating layer 52 has a constriction 82 on which an electric field may concentrate, and thus leakage current may increase disadvantageously.

Figure 15:
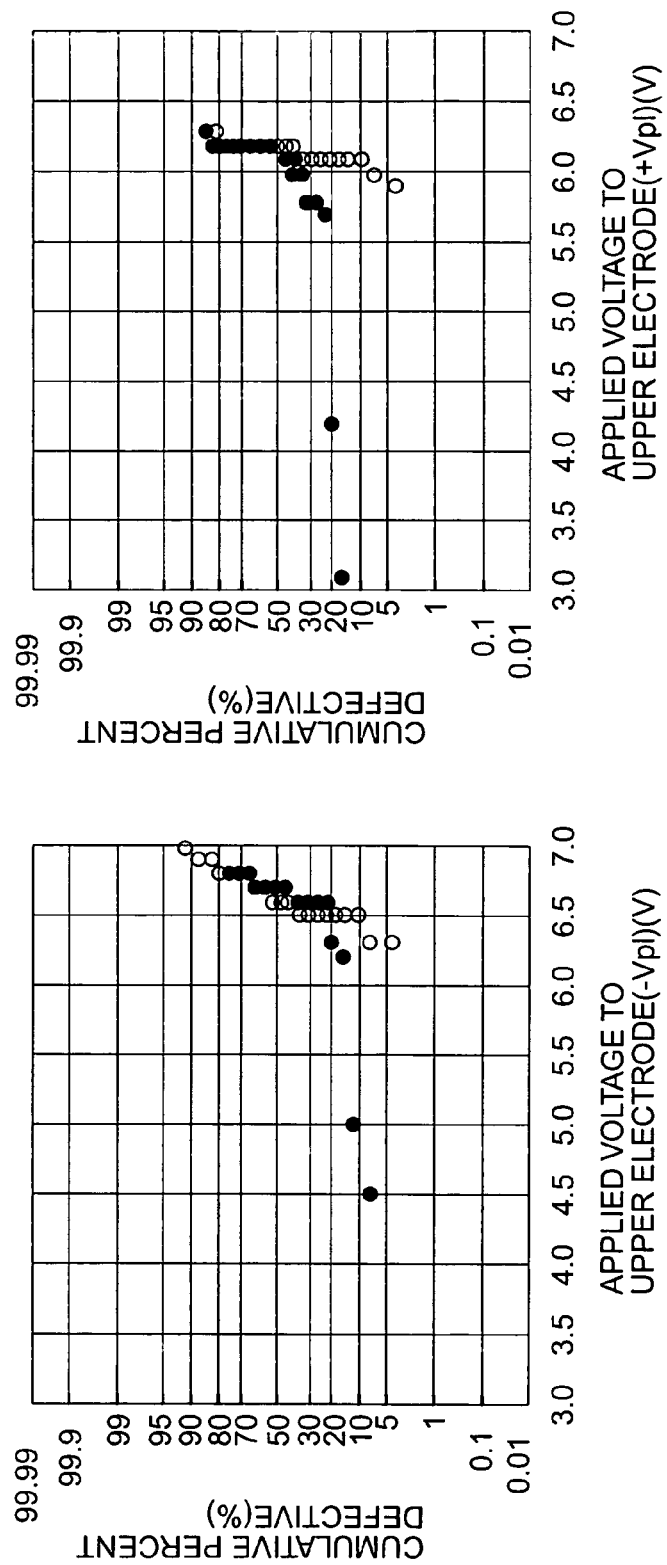
FIGS. 15A and 15B are plots showing withstand voltage characteristics of the capacitors of an Example and the comparative example.

FIGS. 15A and 15B are plots of withstand voltage distributions, namely, TZDB (time zero dielectric breakdown) characteristics. White circles represent the results of specimens prepared in an Example according to the embodiment of the invention, and black circles represent the results of specimens of the comparative example. For the measurements, 23 10-kbit capacitor arrays (test element groups, TEG's) were used as the specimens. The measurements were performed under conditions that voltages of 0 to −10 V were applied to the upper electrode with the lower electrode set at 0 V (FIG. 15A), and under conditions that voltages of 0 to +10 V were applied to the upper electrode with the lower electrode set at 0 V (FIG. 15B). The temperature was set at 90° C. The horizontal axis of each plot represents the applied voltage to the upper electrode, and the vertical axis represents cumulative percent defective.

According to FIG. 15A, in the comparative example, a specimen was broken at −4.5 V and another specimen was broken at −5.0 V, and therefore, about 10% of the specimens exhibited extremely inferior withstand voltage characteristics. On the other hand, in the Example, no specimen was broken until a voltage of −6.3 V was applied, and therefore, no specimen exhibited extremely inferior withstand voltage characteristics. According to FIG. 15B, in the comparative example, a specimen was broken at +3.1 V and another specimen was broken at +4.2 V, and therefore, about 10% of the specimens exhibited extremely inferior withstand voltage characteristics. On the other hand, in the example, no specimen was broken until a voltage of +5.9 V was applied, and therefore, no specimen exhibited extremely inferior withstand voltage characteristics.

This is probably because the capacitor of the comparative example has the capacitor insulating layer 52 having a constriction 82 at the vicinity of the upper end of the lower electrode 51, as shown in FIG. 13. An electric field concentrates on the constriction 82 to increase the leakage current, and consequently defectives exhibiting extremely inferior characteristics are easily produced. On the other hand, the capacitor of the Example has no portion on which an electric field concentrates, and therefore, no defectives exhibiting extremely inferior characteristics are produced.

(4) Modifications

The capacitor insulating layer 52 of the present embodiment is formed of aluminium oxide. Alternatively, the capacitor insulating layer 52 may be formed of a metal oxide containing aluminium oxide, such as aluminium oxide-containing hafnium oxide, tantalum oxide, or zirconium oxide, or a multilayer film of these metal oxides. The structure according to the present embodiment produces a larger effect as the capacitor insulating layer 52 has a lower relative dielectric constant and a smaller thickness. This is because the electric field concentration on the capacitor insulating layer 52 at the vicinity of the upper end of the lower electrode 51 is increased as the electric field applied to the capacitor insulating layer 52 is increased. Therefore, a capacitor insulating layer containing aluminium oxide (relative dielectric constant: 9 to 10) is effective. Further, a capacitor insulating layer 52 having a thickness smaller than or equal to the thickness of the lower electrode 51 is particularly effective (in the embodiment, the capacitor insulating layer 62 and the lower electrode 51 have the same thickness of 6 nm).

Figure 16:
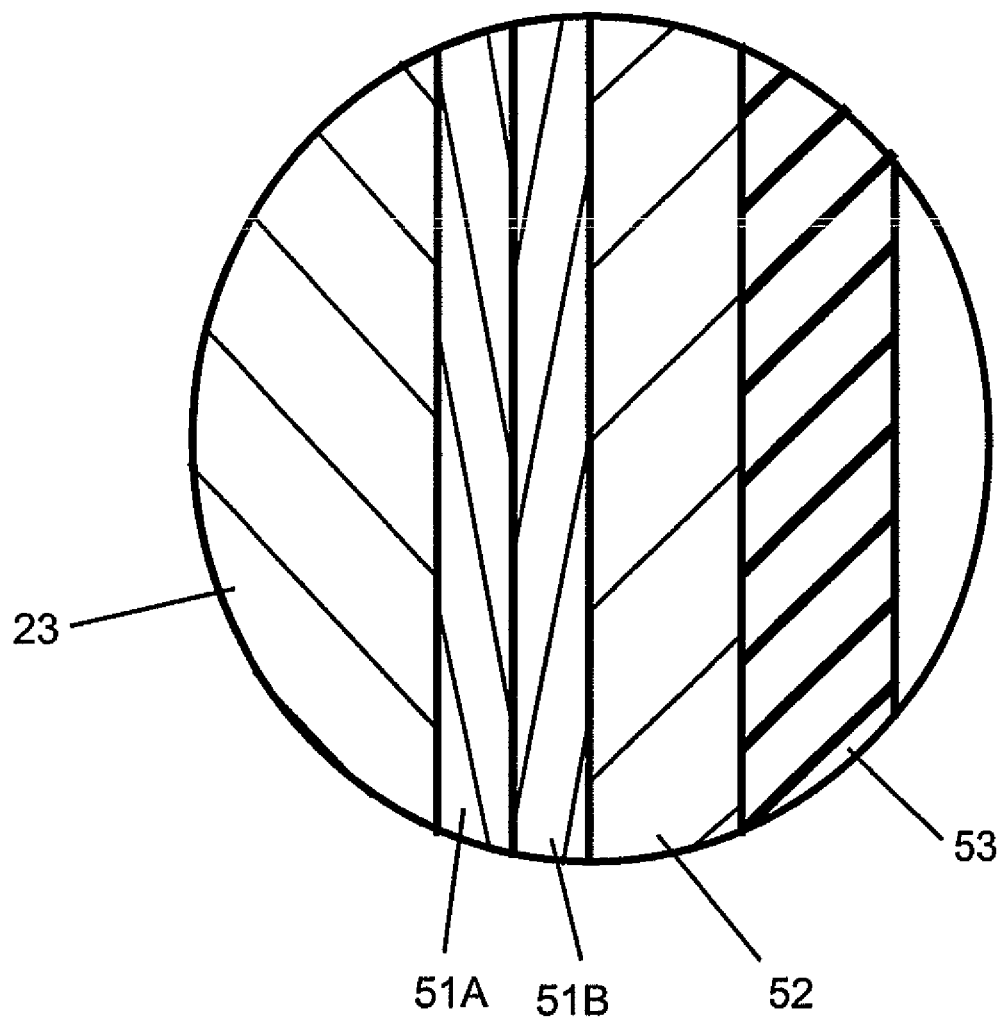
FIG. 16 is an enlarged sectional view of a capacitor of the semiconductor storage device according to one exemplary embodiment.
Figure 17:
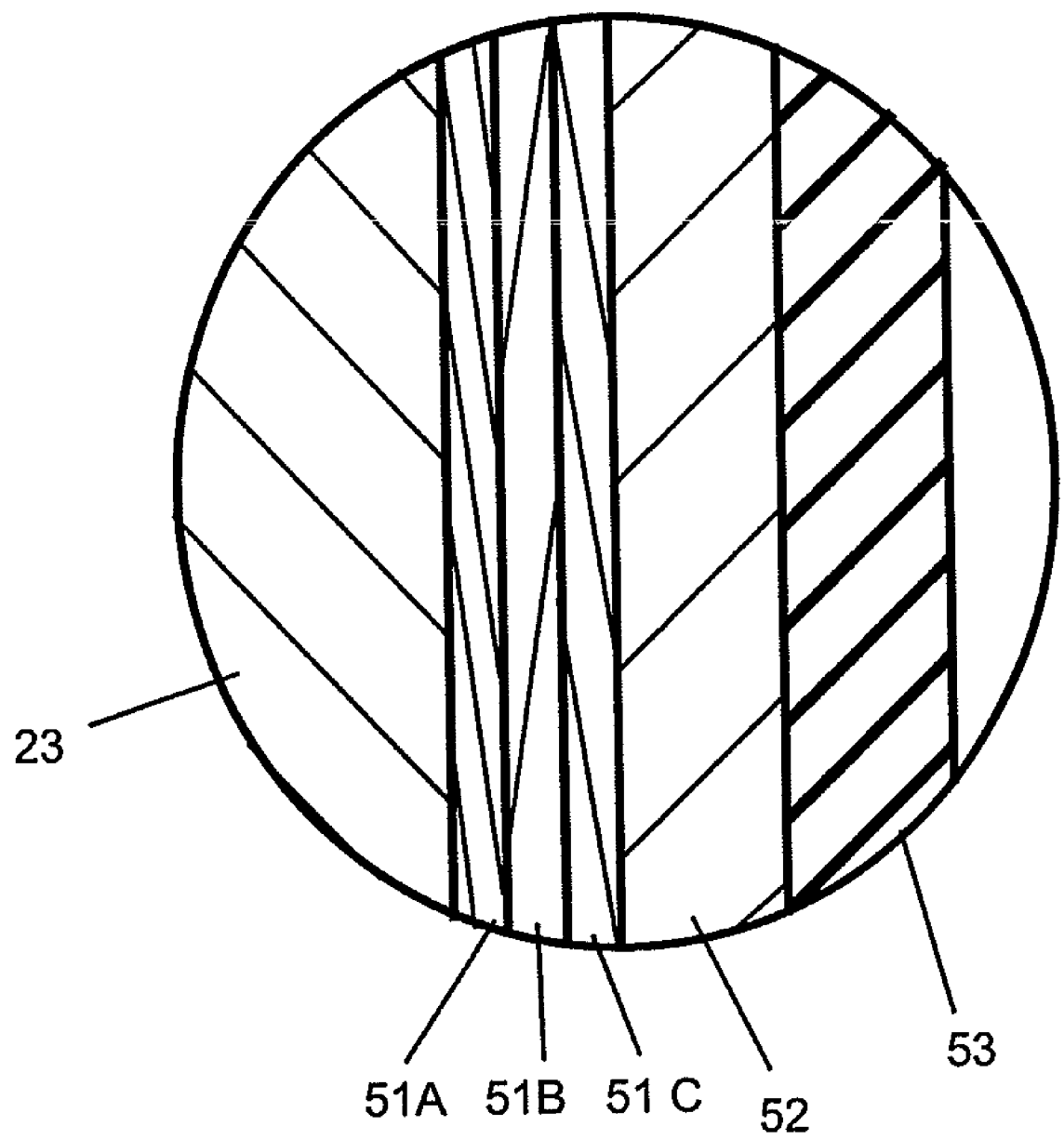
FIG. 17 is an enlarged sectional view of a capacitor of the semiconductor storage device according to one exemplary embodiment.

The lower electrode of the present embodiment is formed of the first titanium nitride layer having a double-layer structure (see FIG. 16) including the first sublayer 51A having a lower nitrogen content and the second sublayer 51B having a higher nitrogen content. Alternatively, the lower electrode may be formed of a titanium nitride layer composed of at least three sublayers (see for exam vie FIG. 17) whose nitrogen contents are gradually increased from a lowermost sublayer 51A, to at least one intermediate sublayer 51B, to an uppermost sublayer 51C. Such a titanium nitride layer further helps control the tilt angle of the upper edge of the lower electrode. A titanium nitride layer composed of a larger number of sublayers whose nitrogen contents are gradually increased is more effective.

For example, a titanium nitride layer composed of three sublayers is formed in the following manner. A first sublayer is formed by thermally decomposing titanium tetrachloride at 640° C. to deposit titanium as in the case of forming the double-layer film, and the titanium is nitrided by heat treatment at the same temperature in a nitrogen atmosphere for 1 minute. Subsequently, a second sublayer having a slightly higher nitrogen content is formed by CVD using titanium tetrachloride and ammonia as the source gas under conditions that the titanium tetrachloride flow rate is higher than the ammonia flow rate. Further, a third sublayer having a higher nitrogen content of 50% is formed under conditions that the ammonia flow rate is higher than the titanium tetrachloride flow rate. By controlling the flow rates of the source gases for depositing the titanium nitride, the nitrogen contents in the sublayers can be varied within the range of 10% to 50%. In order to gradually vary the nitrogen contents, ALD may be applied.

The titanium nitride layer of the present embodiment is formed by CVD using titanium tetrachloride and ammonia as the source gas. Alternatively, an organic source gas may be used, such as TDMAT (tetra(dimethylamino)titanium, Ti(N(CH$_3$)$_2$)$_4$) or TDEAT (tetra(diethylamino)titanium, Ti(N(C$_2$H$_5$)$_2$)$_4$). In use of these gases as the source gas of the titanium nitride layer, organic constituents in the source gas is liable to remain in the titanium nitride layer. In order to avoid this, a thin titanium nitride layer is formed first, and is then heat-treated in an atmosphere of ammonia or the like. This sequence is repeated until the titanium nitride layer has a desired thickness. By controlling conditions of the heat treatment in the plasma atmosphere, for example, treating time, the nitrogen contents in the titanium nitride sublayers can be varied.

The lower electrode of the present embodiment is formed of the multilayer titanium nitride layer including sublayers whose nitrogen contents are varied. Alternatively, the titanium nitride layer may be replaced with a multilayer tantalum nitride, hafnium nitride, or tungsten nitride layer composed of sublayers whose nitrogen contents are varied, or a multilayer titanium nitride silicide, tantalum nitride silicide, or tungsten nitride silicide layer composed of sublayers whose silicon contents or nitrogen contents are varied. These films can produce the same effect.

What is claimed is:

1. A semiconductor storage device comprising:
   a memory cell for storing information that includes a selection MISFET and a capacitor, the capacitor being formed in a hole formed in an insulating layer and including a cup-like lower electrode, an upper electrode, and a capacitor insulating layer disposed between the lower electrode and the upper electrode, the cup-like lower electrode having, on a side of the capacitor insulating layer, an upper edge and an innermost surface extended from the upper edge;
   wherein the cup-like lower electrode has a multilayer structure including:
   a first sublayer; and
   a second sublayer overlying the first sublayer to define the innermost surface and at least a part of the upper edge of the cup-like lower electrode, the innermost surface and at least a part of the upper edge of the cup-like lower electrode defined by the second sublayer being in direct contact with the capacitor insulating layer, the second sublayer having a higher nitrogen content than the first sublayer; and wherein the upper edge of the cup-like lower electrode forms an angle of 45° or less with an internal wall of the hole.

2. The semiconductor storage device according to claim 1, wherein: the lower electrode includes at least three sublayers whose nitrogen contents gradually increase from an outermost sublayer of the cup-like lower electrode to an innermost sublayer of the cup-like lower electrode.

3. The semiconductor storage device according to claim 1, wherein: the lower electrode is made of a metal nitride film.

4. The semiconductor storage device according to claim 1, wherein: the lower electrode is made of a titanium nitride film.

5. The semiconductor storage device according to claim 1, wherein:
the capacitor insulating layer is made of at least one material selected from the group consisting of aluminium oxide, materials containing aluminium oxide, and multilayer composites containing aluminium oxide.

6. A semiconductor storage device having a memory cell, the memory cell comprising a first electrode, a second electrode, and a dielectric film formed between the first and second electrodes, the first electrode having, on a side of the dielectric film, a terminating edge defining a periphery of the first electrode and an upper surface extended from the terminating edge, the first electrode including:

a first conductive layer; and a second conductive layer, between the first conductive layer and the dielectric film, to define the upper surface and at least a part of the terminating edge of the first electrode, the upper surface and at least the part of the terminating edge of the first electrode defined by the second conductive layer being in direct contact with the dielectric film, the second conductive layer being larger in concentration of nitrogen than the first conductive layer.

7. The device as claimed in claim 6, wherein each of the first and second conductive layers comprises a titanium nitride layer.

* * * * *